United States Patent [19]

Witt

[11] Patent Number: 6,081,656

[45] Date of Patent: Jun. 27, 2000

[54] METHOD FOR DERIVING A DOUBLE FREQUENCY MICROPROCESSOR FROM AN EXISTING MICROPROCESSOR

[75] Inventor: David B. Witt, Austin, Tex.

[73] Assignee: Advanced Micro Devices, Inc., Sunnyvale, Calif.

[21] Appl. No.: 08/884,431

[22] Filed: Jun. 27, 1997

[51] Int. Cl.[7] .................................................. G06F 17/50
[52] U.S. Cl. ...................................................... 395/500.04
[58] Field of Search .......................... 395/500.04, 500.02, 395/500.03, 500.07, 500.34, 500.4, 500.44

[56] References Cited

U.S. PATENT DOCUMENTS

| | | | |
|---|---|---|---|
| 5,649,176 | 7/1997 | Selvidge et al. | 395/551 |
| 5,680,318 | 10/1997 | Gregory et al. | 364/489 |
| 5,784,593 | 7/1998 | Tseng et al. | 395/500.36 |
| 5,886,904 | 3/1999 | Dai et al. | 395/500.35 |

*Primary Examiner*—Paul R. Lintz
*Assistant Examiner*—Leigh Marie Garbowski
*Attorney, Agent, or Firm*—Conley, Rose & Tayon, P.C.; Lawrence J. Merkel

[57] ABSTRACT

A first microprocessor having a PH1/PH2 pipeline structure is designed. The first microprocessor undergoes a design cycle including microarchitecture, design (e.g. logic design, circuit design, and layout work), verification, qualification, and volume manufacture. Subsequently, a second microprocessor is derived from the first microprocessor by replacing the PH1 and PH2 latches with edge triggered flip flops connected to a clock line which is operable at approximately twice the frequency of the clock signals used in the PH1/PH2 pipeline. A minimal design effort may be employed to produce the second microprocessor. The microarchitecture of the second microprocessor is quite similar to the microarchitecture of the first microprocessor. Still further, much of the design, verification, and qualification work performed for the first microprocessor may be reused for the second microprocessor.

21 Claims, 13 Drawing Sheets

METHOD FOR DERIVING A DOUBLE FREQUENCY MICROPROCESSOR FROM AN EXISTING MICROPROCESSOR

BACKGROUND OF THE INVENTION

1. Field of the Invention

This invention relates to the field of microprocessors and, more particularly, to methodologies for developing microprocessors.

2. Description of the Related Art

Advances in microprocessor performance have been in large part responsible for major advances in the functionality and capability of personal computer (PC) systems. As a historical rule of thumb, microprocessor performance has doubled every 18 months since the introduction of the first microprocessors in the late 1970's. While the continued increase in microprocessor performance has resulted in many benefits for PC system users, the rapid pace of change underlying the increasing performance has created problems for microprocessor designers.

The rapid increase in performance of microprocessors may lead to a required reduced design cycle for microprocessor designs (i.e. the time from initiation of a project to shipping a product resulting from the project). Since a particular product may exhibit obsolete performance in as few as 18 months, new products with substantially improved performance must be introduced frequently. Additionally, the substantial improvement in performance needed to be competitive in the new products generally requires significant design changes to previous products and often requires a complete redesign.

Advances in semiconductor fabrication technology have fueled the growth in microprocessor performance. As the feature sizes of transistors have steadily decreased, higher frequency operation has resulted from the more rapid switching times and the reduced capacitive load exhibited by the smaller transistors. Additionally, the reduction in feature sizes has lead to an increase in the number of transistors which may profitably be included upon a given semiconductor chip. Die size (i.e. chip area) is limited by yield concerns and other cost-related concerns associated with the manufacture of high volume microprocessors. However, with the reduction in feature size, more transistors may be incorporated upon the relatively fixed die size.

Unfortunately, the increase in the number of available transistors may directly correlate to an increase in design complexity for the microprocessor. This increase in complexity coupled with the above-mentioned reduced cycle times enormously increase demands upon microprocessor designers. The increased complexity leads to an increase in the amount of verification required (e.g. the number and complexity of test vectors needed to verify the design). Additionally, the layout and circuit design tasks may be increased due to the larger number of transistors incorporated into the design. Still further, qualification data indicating that the microprocessor can be profitably manufactured in high volumes must be generated. A methodology for designing microprocessors which alleviates this demand is therefore desired.

SUMMARY OF THE INVENTION

The problems outlined above are in large part solved by a microprocessor design methodology in accordance with the present invention. A first microprocessor having a PH1/PH2 pipeline structure is designed. The first microprocessor undergoes a design cycle including microarchitecture, design (e.g. logic design, circuit design, and layout work), verification, qualification, and volume manufacture. Subsequently, a second microprocessor is derived from the first microprocessor by replacing the PH1 and PH2 latches with edge triggered flip flops connected to a clock line which is operable at approximately twice the frequency of the clock signals used in the PH1/PH2 pipeline. Advantageously, the second microprocessor may achieve a performance level approximately twice that of the first microprocessor. A second, performance-competitive product may thereby be produced from the same microprocessor microarchitecture used to produce the first microprocessor.

Additionally, a minimal design effort may be employed to produce the second microprocessor. The microarchitecture of the second microprocessor is quite similar to the microarchitecture of the first microprocessor. Still further, much of the design, verification, and qualification work performed for the first microprocessor may be reused for the second microprocessor. As a result, a relatively short design cycle may be maintained for the second microprocessor (as compared to the first microprocessor, for example).

Broadly speaking, the present invention contemplates a method for developing a second microprocessor from an existing first microprocessor having a pipeline structure comprising a set of latches clocked by a pair of non-overlapping clock signals. Each of the set of latches is replaced with an edge-triggered flip-flop. A clock line is then connected to the edge-triggered flip-flops.

The present invention further contemplates a method for developing a second microprocessor from an existing first microprocessor having a pipeline structure comprising a set of latches clocked by a pair of non-overlapping clock signals. In addition to replacing each of the set of latches with an edge-triggered flip-flop and connecting a clock line to the edge-triggered flip-flops, the method includes determining if the pipeline structure includes a feedback path. Still further, the method includes determining if the pipeline structure employs phase-borrowing.

Moreover, the present invention contemplates a method for developing a first microprocessor and a second microprocessor. The first microprocessor is designed, verified, and manufactured. The first microprocessor has a pipeline structure comprising a set of latches clocked by a pair of non-overlapping clock signals. Each of the set of latches is replaced with an edge-triggered flip-flop to which a clock line is connected. Additionally, the method includes determining if the pipeline structure includes a feedback path and determining if the pipeline structure employs phase-borrowing.

BRIEF DESCRIPTION OF THE DRAWINGS

Other objects and advantages of the invention will become apparent upon reading the following detailed description and upon reference to the accompanying drawings in which.

Figure 1:
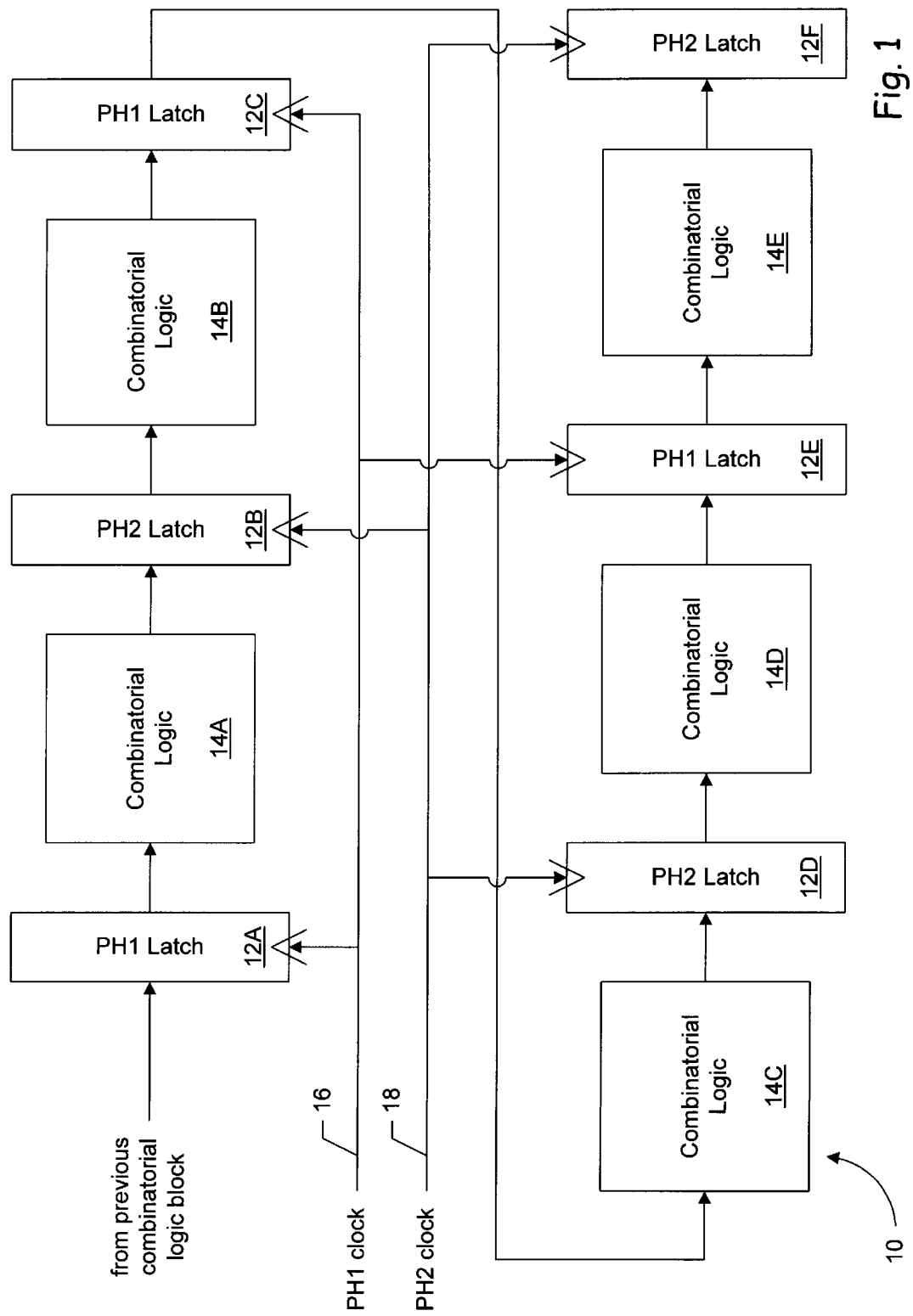
FIG. 1 is a block diagram of a portion of a PH1/PH2 pipeline structure.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a portion of one embodiment of a pipeline 10 is shown. Pipeline 10 includes a set of latches 12A–12F and combinatorial logic blocks 14A–14E interspersed therebetween as shown in FIG. 1. A PH1 clock line 16 and a PH2 clock line 18 are connected to alternating ones of latches 12A–12F (i.e. PH1 clock line 16 is connected to latches 12A, 12C, and 12E and PH2 clock line 18 is connected to latches 12B, 12D, and 12F).

Pipeline 10 may be employed in a first microprocessor designed in accordance with the methodology described herein. Pipeline 10 employs a PH1/PH2 pipeline structure. In a PH1/PH2 pipeline structure, alternating latches 12 are clocked by non-overlapping clock signals provided on PH1 clock line 16 and PH2 clock line 18. A pipeline stage is defined to be the combination of a combinatorial logic block receiving input from a PH2 latch and providing output to a PH1 latch, and the combinatorial logic block receiving input from that PH1 latch and providing output to a PH2 latch. For example, combinatorial logic blocks 14B and 14C comprise a pipeline stage. A set of inputs are provided to the pipeline stage during a clock cycle. A succeeding set of inputs are provided to the pipeline stage during a succeeding clock cycle.

Generally, clock signals are periodic waveforms which repeat their switching pattern with a predetermined period referred to as the clock cycle. For example, the clock signal may have a rising edge (from a logical low level to a logical high level), a logical high level during a first period of time subsequent to the rising edge, a falling edge (from the logical high level to the logical low level), and a logical low level during a second period of time subsequent to the falling edge. The amount of time elapsing between rising edges (or falling edges) is the clock cycle. It is noted that the first period of time and the second period of time need not be equal. In a PH1/PH2 pipeline structure, two clock signals are used. The clock signals are non-overlapping, meaning that the portion of the first clock signal which "opens" the latch (i.e. allowing the input to pass through to the output of the latch) does not overlap, in time, with the corresponding portion of the second clock signal.

Generally, latches 12A–12F are configured to be "open" when the clock signal attached thereto is at a first logical value, and "closed" when the clock signal attached thereto is at a second logical value. For example, the latch may be open when the clock signal is at a high logical value and closed when the clock signal is at a low logical value. Alternatively, the latch may be open when the clock signal is at a low logical value and closed when the clock signal is at a high logical value. When the latch is open, the value presented at the input of the latch is allowed to flow through to the output of the latch. When the latch is closed, the value existing upon the input at the closing time is maintained (or stored) by the latch upon the output of the latch. The output of the latch is isolated from any changes which may occur at the input to the latch while the latch is closed.

In the absence of "phase borrowing" (or "cycle stealing"), each combinatorial logic block 14A–14E is configured to evaluate in one half of the clock cycle employed by the PH1 and PH2 clock signals (i.e. the delay between providing an input to the combinatorial logic block 14A–14E and the corresponding output being calculated by the combinatorial logic block 14A–14E is less than or equal to ½ clock cycle). A combinatorial logic block is often characterized as employing a number of logic levels (e.g. the delay of the combinatorial logic block is equivalent to a cascaded set of gates equal in number to the number of logic levels).

When the latch or latches which provide input to the combinatorial logic block 14A–14E closes, the input to that combinatorial logic block is maintained at a steady value. Up until the time that the latch closes, the input to that combinatorial logic block may change. Additionally, the latch or latches to which the combinatorial logic block 14A–14E provides input (the output latch) opens after the input latch to the combinatorial logic block 14A–14E closes. Prior to the output latch closing, the combinatorial logic block 14A–14E completes evaluation based on the input provided by the input latch. Therefore, each combinatorial logic block 14A–14E logically evaluates during the period of time between the closing of its input latch and the closing of its output latch. It is noted that the actually switching of the logic gates within a particular combinatorial logic block 14A–14E may occur prior to the closing of the input latch and may complete prior to the closing of the output latch depending upon the completion of evaluation of the combinatorial logic block 14A–14E which provides input to the input latch of the particular combinatorial logic block.

In certain circumstances, it may be advantageous to employ "phase borrowing". Phase borrowing refers to the allocation of evaluation time from one combinatorial logic block 14A–14E to another combinatorial logic block 14A–14E. For example, if combinatorial logic block 14B were to phase borrow from combinatorial logic block 14A, combinatorial logic block 14A is configured to complete evaluation in less than ½ of a clock cycle, thereby providing an input to latch 12B substantially prior to the time at which latch 12B closes. The input is thereby provided to combinatorial logic block 14B, which begins evaluating.

Subsequently, latch 12B closes, storing the input value provided by combinatorial logic block 14A. Combinatorial logic block 14B continues evaluating, and may complete evaluation just prior to latch 12C closing. In this manner, combinatorial logic block 14B may utilize more the ½ of a clock cycle to evaluate.

It is noted that latches 12A, 12C, and 12E are labeled as PH1 latches in FIG. 1, while latches 12B, 12D, and 12F are labeled as PH2 latches. A latch becomes a PH1 latch or a PH2 latch by virtue of which of the clock lines 16 or 18 is connected to the clock input of the latch. The internal circuitry of the PH1 latch may be similar, or even identical, to the internal circuitry of the PH2 latch.

Figure 2:
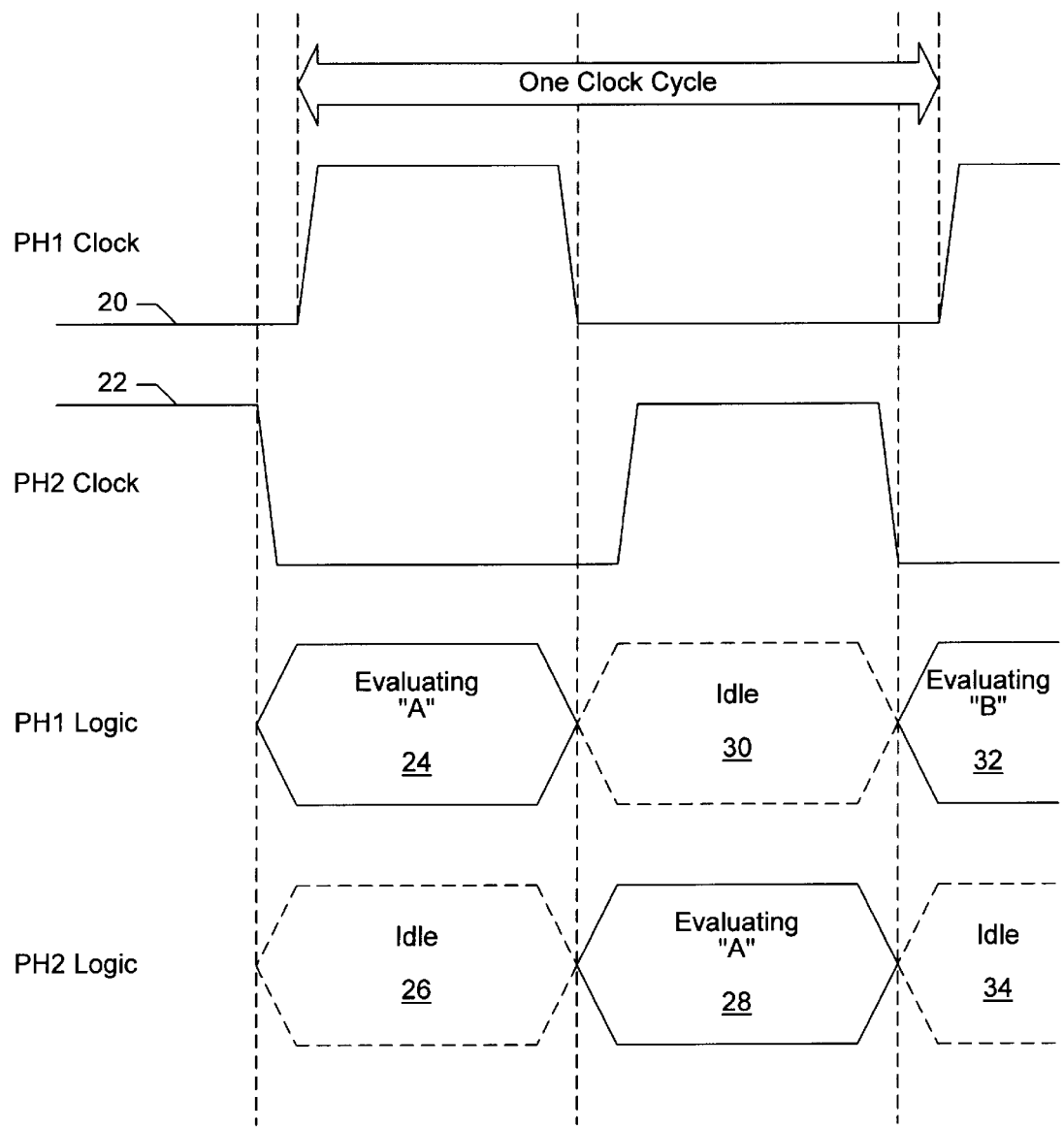
FIG. 2 is a timing diagram illustrating one clock cycle as performed by the pipeline structure shown in FIG. 1.

FIG. 2 is a timing diagram which illustrates an exemplary clock cycle and the operation of the combinatorial logic blocks 14A–14E shown in FIG. 1. A PH1 clock signal 20 which may be provided upon PH1 clock line 16 during use and a PH2 clock signal 22 which may be provided upon PH2 clock line 18 during use are shown in FIG. 2. Additionally, the activity of combinatorial logic blocks 14A–14E is illustrated.

Combinatorial logic blocks 14A–14E may be divided into two types: PH1 logic and PH2 logic. PH1 logic is logic which evaluates when latches connected to PH1 clock line 16 are open. Similarly, PH2 logic is logic which evaluates when latches connected to PH.2 clock line 18 are open. Therefore, as shown in FIG. 1, combinatorial logic blocks 14B and 14D are PH1 logic and combinatorial logic blocks 14A, 14C, and 14E are PH2 logic. For the example of FIG. 2, latches 12A–12F are configured to be open when the corresponding clock signal is high and closed when the corresponding clock signal is low.

As FIG. 2 illustrates, the PH1 logic evaluates upon a set of inputs "A" during a first portion of a clock cycle, providing input to the PH1 latches connected thereto prior to the falling edge of PH1 clock signal 20 (e.g. reference numeral 24). The PH2 logic is logically idle during this time period, since the input PH1 latches have not yet closed (e.g. reference numeral 26). Subsequently, the PH2 logic evaluates upon the set of inputs "A" (as modified by the PH1 logic, reference numeral 28). While the PH2 logic evaluates, the PH1 logic is logically idle (reference numeral 30).

During a subsequent clock cycle, the PH1 logic may evaluate upon a second set of inputs "B" which succeed set of inputs "A" (reference numeral 32). The PH2 logic is idle while the PH1 logic evaluates (reference number 34), and then evaluates during the second half of the subsequent clock cycle (not shown).

According to one embodiment of the present methodology, a second pipeline is created from pipeline 10. The second pipeline forms a pipeline stage out of each combinatorial logic block 14A–14E. The second pipeline may thereby be operable at approximately twice the frequency (or ½ of the clock cycle) of the first pipeline. Accordingly, the second pipeline may be operable at approximately twice the performance of pipeline 10. However, the second pipeline substantially retains the combinatorial logic blocks 14A–14E from pipeline 10, thereby leveraging the work already completed for pipeline 10. For example, much of the verification, logic design, circuit design, layout, qualification data, etc. performed for pipeline 10 may be reused in the second pipeline. Advantageously, a microprocessor based upon the second pipeline may exit the design cycle quickly and employ relatively few design resources, while delivering substantially increased performance over a microprocessor based upon pipeline 10.

The methodology may comprise the following: a microprocessor may be designed with the structure of pipeline 10. Subsequently, a new microprocessor may be designed using a substantially different microarchitecture (e.g. functional partition as well as functionality included). In parallel with designing the new microprocessor, a microprocessor employing the second pipeline may be quickly developed and brought to market. Since a microprocessor using the second pipeline delivers substantially improved performance over the microprocessor based upon pipeline 10, a competitive product may be quickly developed and brought to market. Effectively, the design cycle of the new microprocessor (which may involve substantially more effort and resources than the microprocessor having the second pipeline) may be longer without losing competitive edge in the market place.

Figure 3:
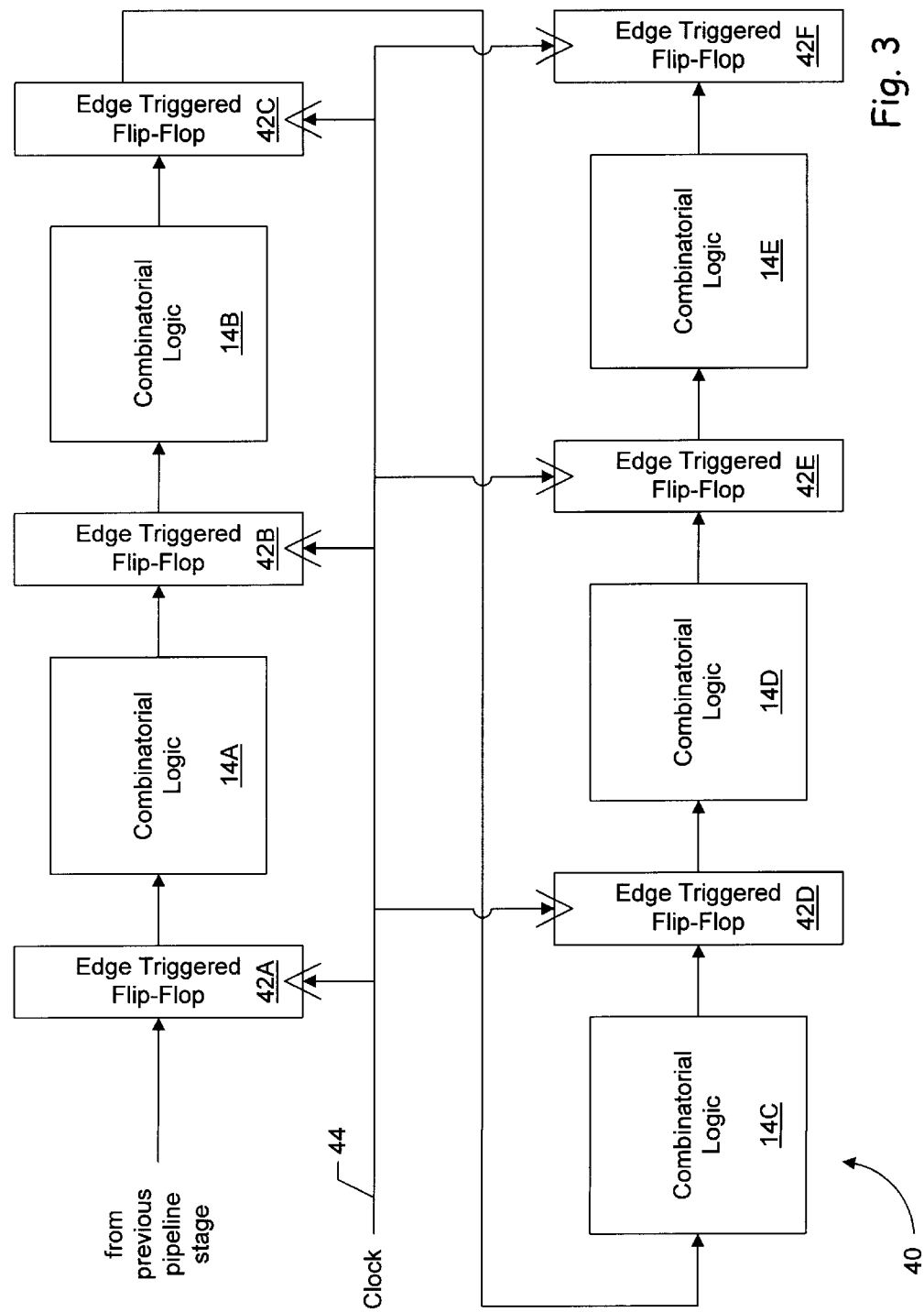
FIG. 3 is a block diagram of the pipeline structure shown in FIG. 1 converted to a double frequency pipeline.

FIG. 3 illustrates a second pipeline 40 developed from pipeline 10 according to the present methodology. Combinatorial logic blocks 14A–14E are included in pipeline 40, interspersed between a set of edge-triggered flip-flops 42A–42F. Each of flip-flops 42A–42F is connected to a clock line 44 which provides a clock signal during use.

Flip flops 42A–42F are configured to sample the input thereto at a predetermined time as opposed to the open/close operation of latches 12. In particular, flip-flops 42A–42F sample their inputs at a rising (or alternatively a falling) edge of the clock signal provided upon clock line 44. To sample the input, the flip-flop opens for a short period of time around the rising edge (or falling edge) of the clock signal. The period of time is sufficient for the internal circuitry of the flip-flop to determine the value of the input and to store the value, and then the flip-flop closes.

Pipeline 40 may be capable of operating at approximately twice the frequency of pipeline 10, despite using substantially the same combinatorial logic blocks 14. Since the flip-flops are edge-triggered instead of operating in the PH1/PH2 manner described above, a particular combinatorial logic block which was formerly PH1 logic (e.g. combinatorial logic block 14B) may operate upon a set of inputs "A" while another combinatorial logic block which was formerly PH2 logic (e.g. combinatorial logic block 14A) may operate upon a subsequent set of inputs "B". Advantageously, the performance available from pipeline 40 may be approximately twice that of pipeline 10.

Figure 4:
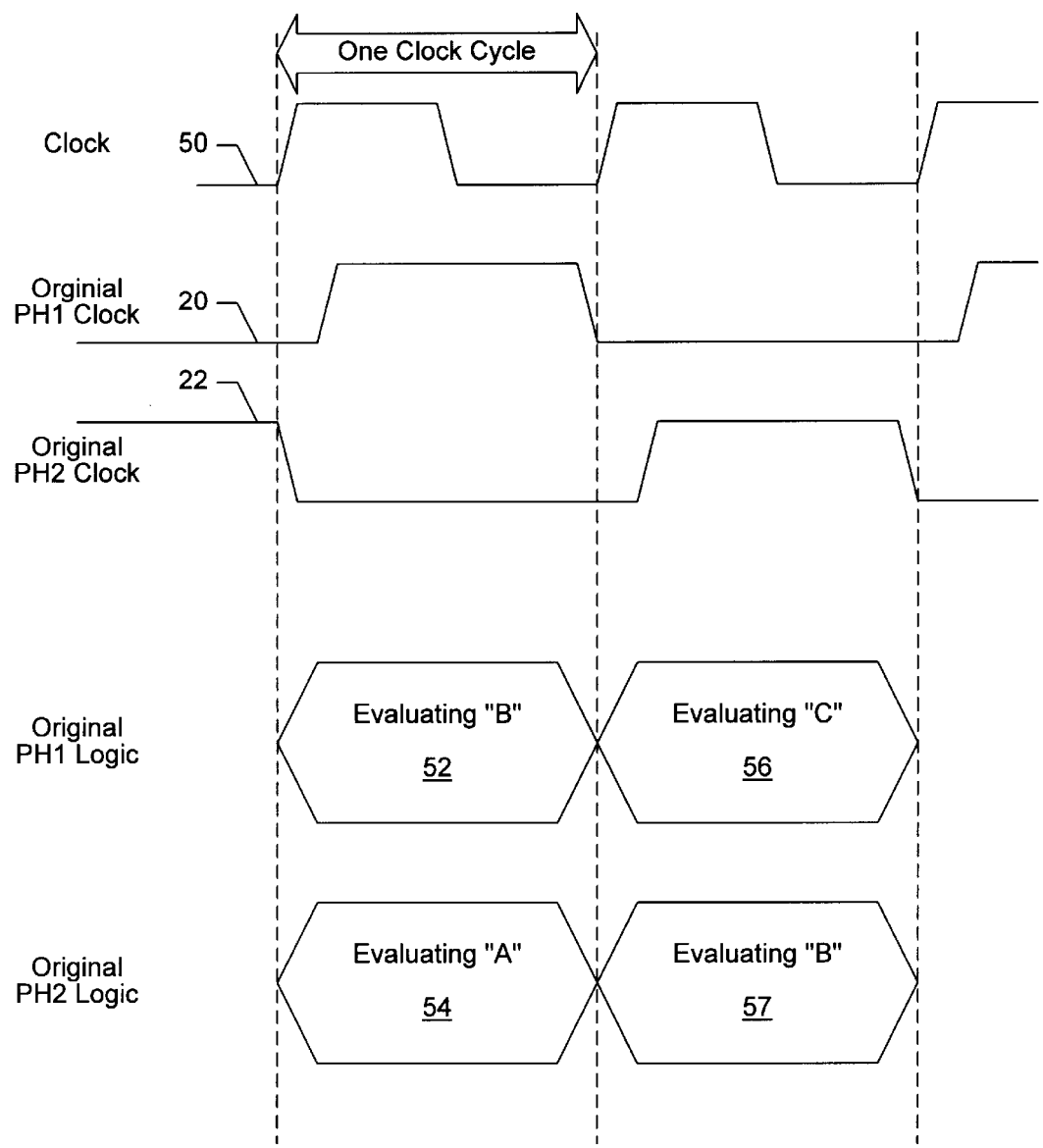
FIG. 4 is a timing diagram illustrating two clock cycles as performed by the pipeline structure shown in FIG. 3.

FIG. 4 is a timing diagram illustrating the operation of pipeline 40. PH1 clock signal 20 and PH2 clock signal 22 from FIG. 2 are shown for comparison purposes. Additionally, a clock signal 50 is illustrated. Clock signal 50 may be conveyed upon clock line 44 shown in FIG. 3. Clock signal 50 has a period which is approximately ½ of the period of PH1 clock signal 20 or PH2 clock signal 22.

As FIG. 4 illustrates, the idle times for each combinatorial logic block 14A–14E have been eliminated. Instead, for example, logic blocks which were PH1 logic in pipeline 10 operate upon a set of inputs "B" concurrent with logic blocks which were PH2 logic in pipeline 10 operating upon a set of inputs "A" (reference numerals 52 and 54). Similarly, as illustrated at reference numerals 56 and 57, logic blocks which were PH1 logic operate upon a set of inputs "C" concurrent with logic blocks which were PH2 logic operating upon the set of inputs "B". Therefore, any set of inputs provided to pipeline 40 progress through pipeline 40 approximately twice as fast as the set of inputs progresses through pipeline 10.

The above discussion has indicated that clock signal 50 may be operable at approximately twice the frequency of PH1 clock signal 20 or PH2 clock signal 22, and that the performance achieved by pipeline 40 may be approximately twice that of pipeline 10 (if fabricated using the same semiconductor fabrication process). If phase borrowing and feedback paths are not employed in pipeline 10, then clock signal 50 may achieve twice the frequency of PH1 clock signal 20 or PH2 clock signal 22. If phase borrowing or feedback paths are employed in pipeline 10, then the frequency achievable by clock signal 50 may be somewhat less than twice the frequency achievable by PH1 clock signal 20 or PH2 clock signal 22, or the performance achieved by pipeline 40 may be somewhat less than twice the performance of pipeline 10. Additional discussion of frequency and performance achievements is provided below.

Generally, a feedback path exists in pipeline 10 if a value generated by a combinatorial logic block is provided to a preceding combinatorial logic block. A first combinatorial logic block precedes a second combinatorial logic block in a pipeline if a set of inputs provide to the beginning of the pipeline are received in the first combinatorial logic block prior to being received in the second combinatorial logic block.

Since the inputs being operated upon concurrently be the combinatorial logic blocks are different in pipeline 40 than they were in pipeline 10, the original feedback paths between combinatorial logic blocks 14A–14E are incorrect for pipeline 40. In other words, the information being fed back is received by the receiving combinatorial logic blocks at a time after the receiving logic blocks have operated upon a set of inputs to which the feedback information corresponds.

Figure 5:
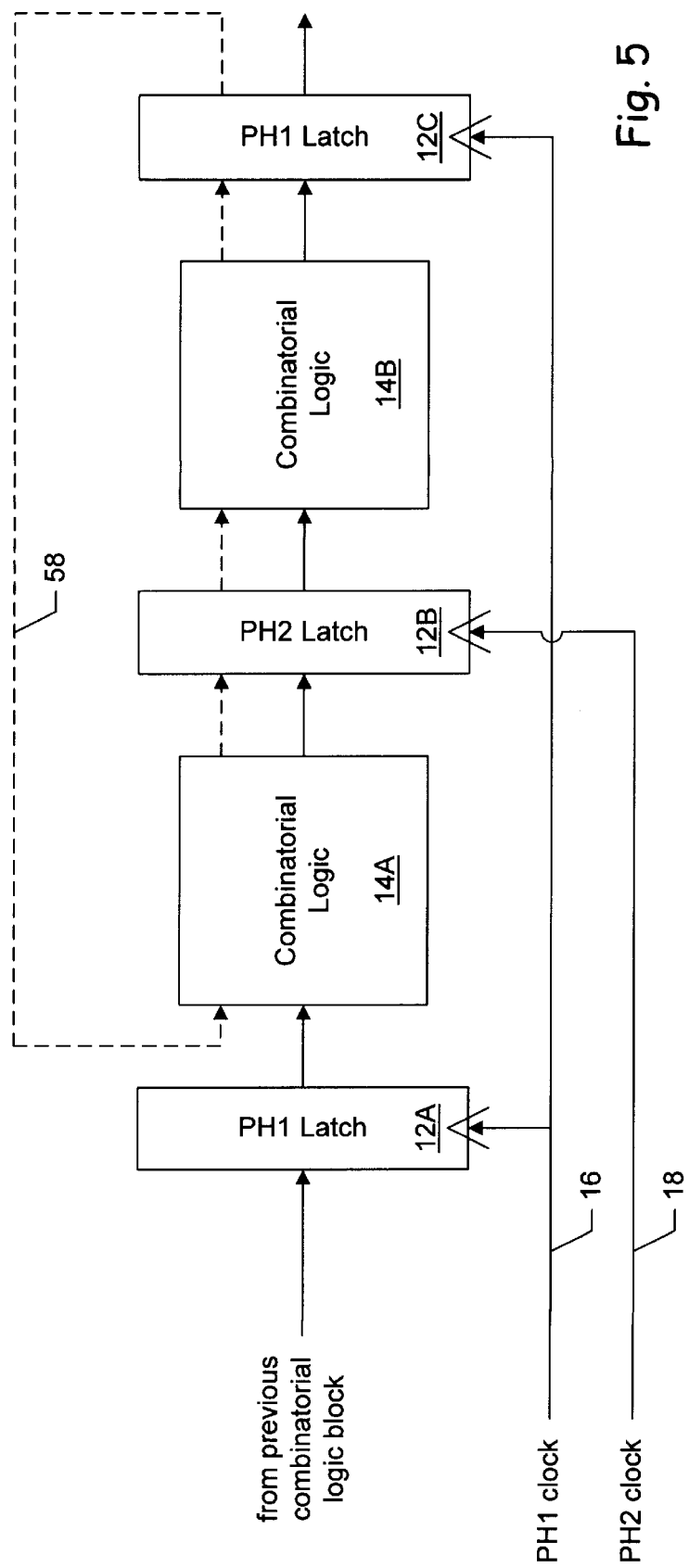
FIG. 5 is a block diagram illustrating an exemplary feedback path in a portion of the pipeline shown in FIG. 1.

For example, an exemplary feedback path 58 between combinatorial logic blocks 14A and 14B (through latches 12B and 12C) is shown in FIG. 5. Feedback path 58 conveys information which, when combinatorial logic block 14B is operating upon a set of inputs "A", is associated with a succeeding set of inputs "B". In pipeline 10, combinatorial logic block 14A is operating upon set of inputs "B" when the feedback information is received via feedback path 58. However, in pipeline 40, combinatorial logic block 14A operates upon the succeeding set of inputs "B" concurrent with the set of inputs "A" being operated upon by combinatorial logic block 14B. When combinatorial logic block 14A receives the feedback information from combinatorial logic block 14B (through flip-flops 42B and 42C), combinatorial logic block 14A is operating upon a set of inputs "C" succeeding set of inputs "B". The feedback paths from pipeline 10 are therefore adjusted when forming pipeline 40, as described below with respect to FIG. 6.

Figure 6:
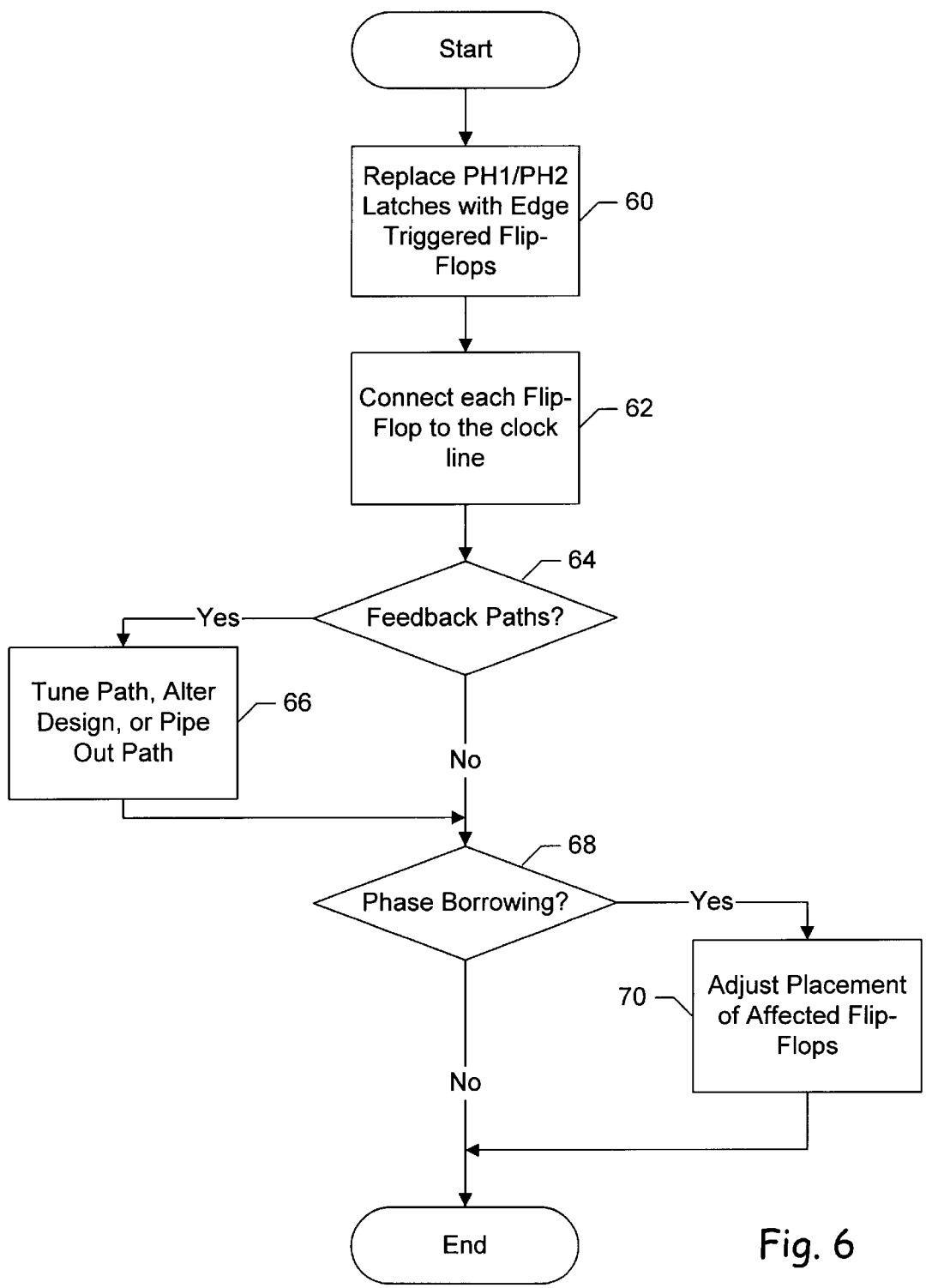
FIG. 6 is a flow chart illustrating one embodiment of a methodology for converting the pipeline of a microprocessor.

Turning now to FIG. 6, a flow chart is shown illustrating one embodiment of a methodology of converting a PH1/PH2 pipeline structure (e.g. pipeline 10) to a pipeline using edge-triggered flip flops (e.g. pipeline 40). Prior to performing the steps shown in FIG. 6, a microprocessor is designed having a PH1/PH2 pipeline structure. The microprocessor is subsequently verified and manufactured.

The PH1 /PH2 latches in pipeline 10 are replaced with edge-triggered flip-flops (step 60), and each flip-flop is connected to the clock line (step 62). The resulting pipeline is then analyzed to determine if any feedback paths exist in the pipeline (decision block 64). If feedback paths are detected, then the feedback paths are adjusted in pipeline 40 (step 66).

Figure 7:
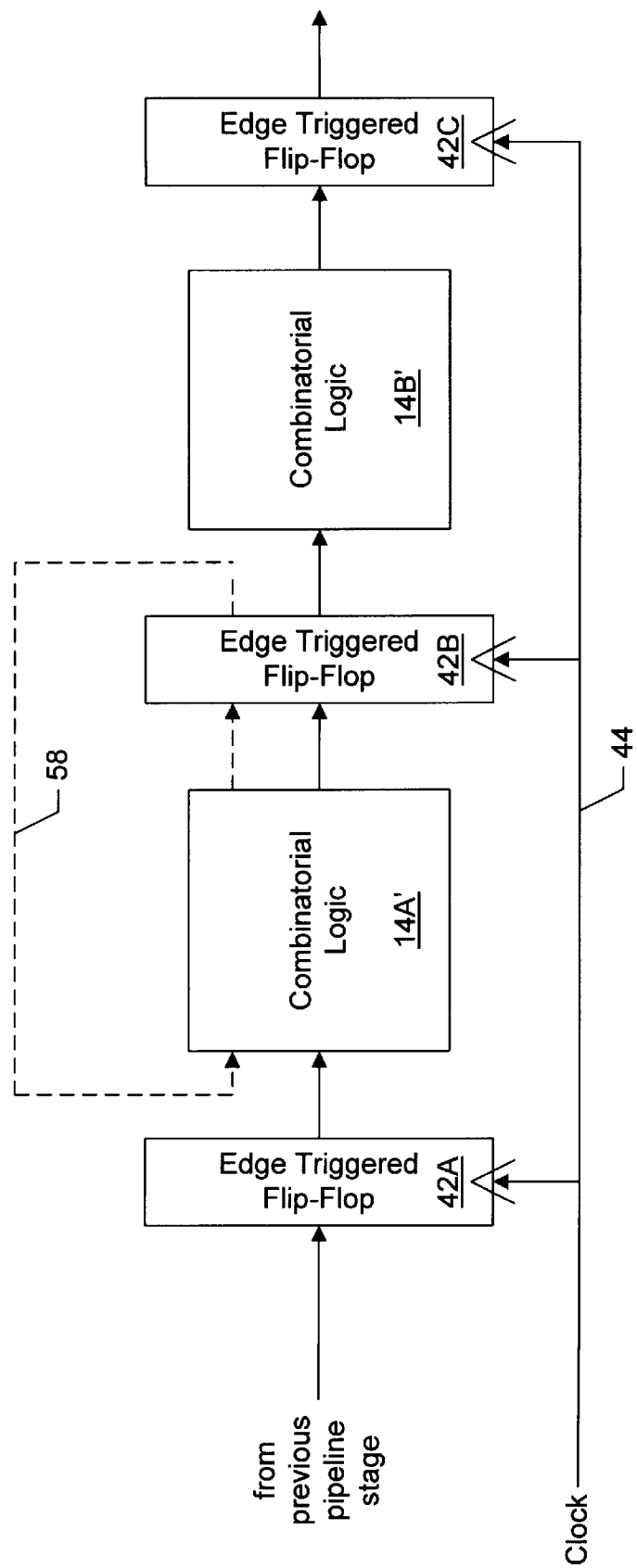
FIG. 7 is a block diagram illustrating the exemplary feedback path shown in FIG. 5 subsequent to tuning the feedback path.

Several methods may be used to adjust the feedback path. First, the feedback path can be tuned so that the feedback information is generated during one pipeline stage of pipeline 40. Tuning may be a viable option if the feedback path was not a critical path in pipeline 10, for example. If the number of logic levels used to calculate the feedback information can be reduced to the number of logic levels in one pipeline stage of pipeline 40, then the feedback path can be implemented. FIG. 7 illustrates the result of tuning feedback path 58. Combinatorial logic block 14A' comprises combinatorial logic block 14A along with a tuned feedback path 58. Combinatorial logic block 14B' comprises combinatorial logic block 14B without the logic for forming feedback path 58.

Alternatively, the design of the affected pipeline stage or stages can be redesigned such that the feedback path is eliminated. However, the redesigned pipeline stage or stages interface to the remaining pipeline stages in a mariner similar to the original pipeline stage or stages. In this manner, the remaining pipeline stages may not require modification. If the design of the pipeline stage or stages is modified, it is possible that the performance achieved by pipeline 40 may be more or less than twice the performance of pipeline 10, depending upon the number of pipeline stages added in the modification and the activities performed therein.

Figure 8:
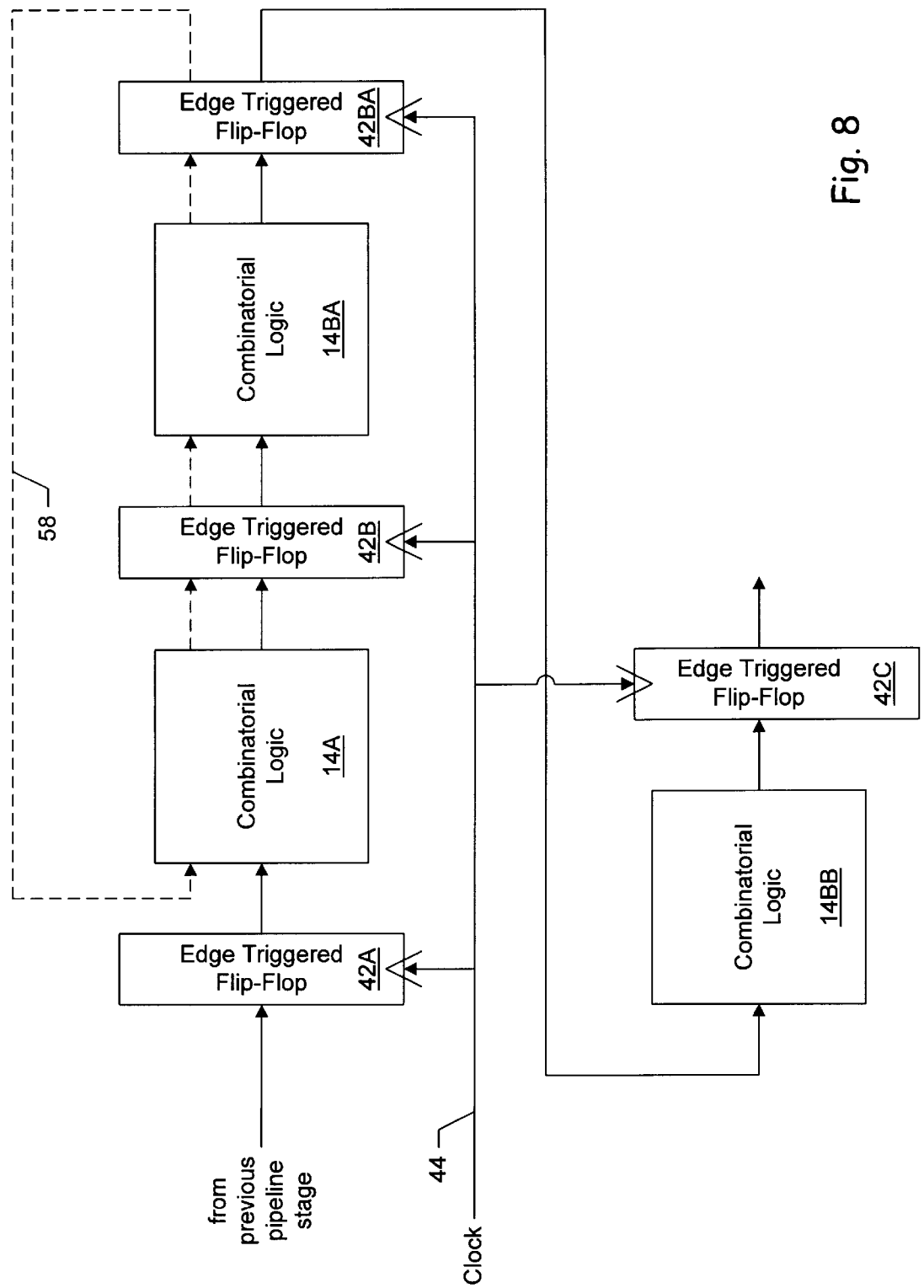
FIG. 8 is a block diagram illustrating the exemplary feedback path shown in FIG. 5 subsequent to piping out the feedback path.

A third method for handling the feedback path is to add a pipeline stage in order to complete generation of the feedback. This method is also referred to as "piping out" the pipeline, since a stage is added into the pipeline to allow for performing the feedback path. If the third method for handling the feedback path is employed, it is possible that the performance achieved by pipeline 40 may be less than twice the performance of pipeline 10. For example, if the pipeline is an instruction processing pipeline of a microprocessor and the added stage increases the branch misprediction penalty of the microprocessor, performance may be reduced. FIG. 8 is a block diagram showing the piping out of exemplary feedback path 58. Combinatorial logic block 14A is unmodified in the example of FIG. 8. Combinatorial logic block 14BA comprises the portion of combinatorial logic block 14B which forms feedback path 58. Combinatorial logic block 14BB comprises the remaining portions of combinatorial logic block 14B.

Figure 9:
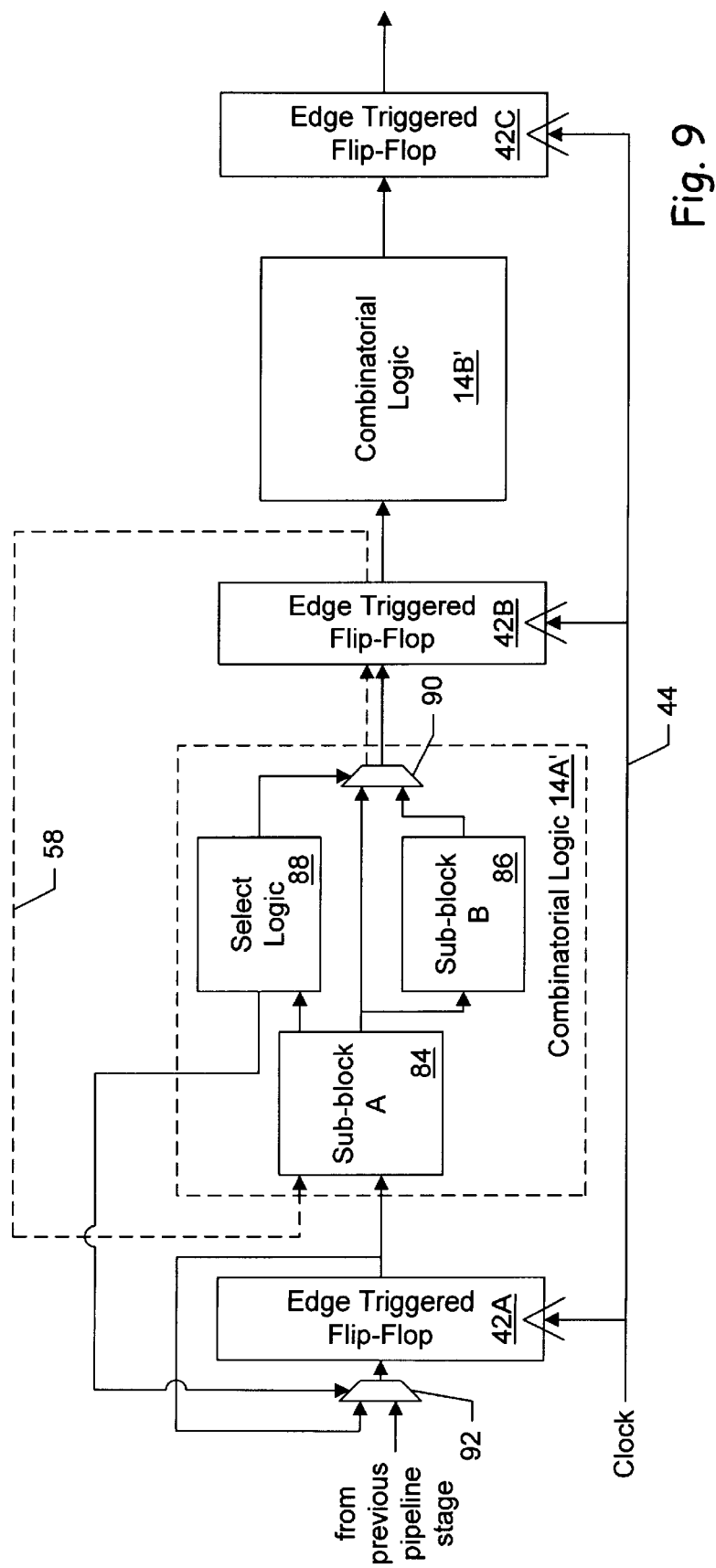
FIG. 9 is a block diagram illustrating the exemplary feedback path shown in FIG. 5 eliminated using an identify and stall method.

A fourth method for handling feedback paths is illustrated in FIG. 9. The circuitry in FIG. 9 employs an identify and stall method for generating feedback via feedback path 58. FIG. 9 includes combinatorial logic block 14A', which includes logic for generating feedback information for feedback path 58 (within sub-block A 84 and sub-block B 86) as well as the logic originally within combinatorial logic 14A (within sub-block A 84). Furthermore, combinatorial logic block 14A' includes select logic block 88 which is configured to provide select signals to multiplexors 90 and 92.

Generally, the circuitry in FIG. 9 detects situations in which feedback path 58 is activated and stalls the pipeline to allow sufficient time for the feedback information to be generated via sub-block A 84 and sub-block B 86. Additionally, select logic 88 causes multiplexor 92 to select the output of flip-flop 42A as the input to flip-flop 42A (thereby holding the present value for an additional clock cycle) when feedback information is being generated. Therefore, combinatorial logic block 14A' is allowed two clock cycles in which to generate the feedback information. Pipeline stages prior to the stage including combinatorial logic block 14A' are stalled if feedback is generated. If feedback information is not generated during evaluation of sub-block A 84, select logic 88 causes multiplexor 90 to select the output of sub-block A 84 and further causes multiplexor 92 to select input from a previous pipeline stage.

In this manner, the pipeline is not stalled if feedback path 58 is not to be activated.

Sub-block A 84 evaluates in approximately one clock cycle of clock signal 50 and sub-block B 86 evaluates in approximately one clock cycle as well. Therefore, the path from sub-block A 84 through sub-block B 86 and multiplexor 90 to flip-flop 42B employs approximately two clock cycles to evaluate. On the other hand, the path through sub-block A 84 and multiplexor 90 employs only one clock cycle. An embodiment such as that shown in FIG. 9 may be particularly desirable if a large majority of values propagate through sub-block A 84 and multiplexor 90 (i.e. without generating feedback information via feedback path 58). The larger the majority of values which do not employ feedback path 58, the more closely pipeline 40 may approach twice the performance of pipeline 10.

It is noted that other methods for handling the feedback paths from pipeline 10 may be employed as well, according to design choice.

In addition to analyzing pipeline 40 for feedback paths to be adjusted, pipeline 40 is analyzed to detect phase borrowing (decision block 68). If phase borrowing is detected, the placement of the flip-flops is adjusted (step 70). For example, the placement (within the clock cycle) of the sampling point of a flip-flop between the phase-borrowing combinatorial logic block and the logic block from which the phase is borrowed may be performed. By moving the sampling point of the flip-flop with respect to other flip-flops within pipeline 40, the time allocated for the phase-borrowee combinatorial logic block may be reduced and the time allocated for the phase-borrowing logic block may be increased.

Alternatively, flip-flops may be included within the phase-borrowing combinatorial logic block instead of at the output of the phase-borrowing combinatorial logic block. Effectively, this alternative places some of the logic formerly allocated to the phase-borrowing combinatorial logic block into the combinatorial logic block from which phase is borrowed. The logic blocks may thereby become balanced and may evaluate within one clock cycle of the clock signal upon clock line 44.

Figure 10:
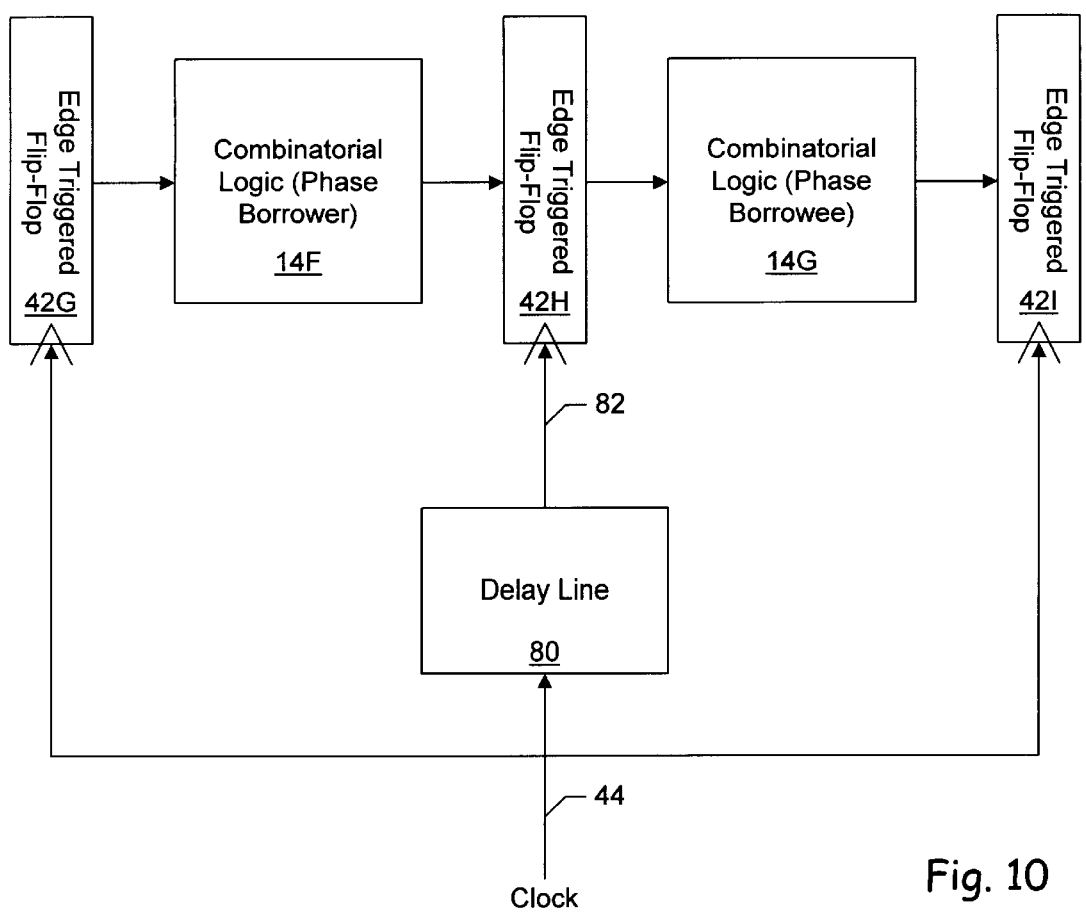
FIG. 10 is a block diagram illustrating one embodiment for handling phase borrowing according to the methodology shown in FIG. 5.

FIG. 10 is a block diagram illustrating one embodiment of handling phase-borrowing in pipeline 40. FIG. 10 includes edge-triggered flip-flops 42G, 42F, and 42I. Additionally, combinatorial logic blocks 14F and 14G are included as well as a delay line 80. Flip-flops 42G and 42I are connected to clock line 44. Also, delay line 80 is connected to a delayed clock line 82 which provides clocking for flip-flop 42H.

Combinatorial logic block 14F borrows phase from combinatorial logic block 14G in pipeline 10. Therefore, combinatorial logic block 14F evaluates in an amount of time greater than the period of the clock signal upon clock signal line 44. In order to accomplish the phase borrowing in pipeline 40, the sampling point of flip-flop 42H is altered by delaying the clock signal upon clock line 44 and presenting the delayed clock signal upon delayed clock line 82. The rising edge of the delayed clock signal occurs later in time than the rising edge of the clock signal. The amount of delay provided by delay line 80 is adjusted such that the amount of time provided to combinatorial logic block 14F is large enough to allow combinatorial logic block 14F to evaluate prior to flip-flop 42H sampling the output value of combinatorial logic block 14F.

Due to process variations which may occur during manufacture of integrated circuits (among other possible sources of variation), delay line 80 may provide a varying delay in the manufactured products employing pipeline 40 (e.g. microprocessors). Therefore, a margin of error for delay line 80 may be designed into pipeline 40. If the total evaluation time of combinatorial logic blocks 14F and 14G is substantially equal to twice the period of the clock signal upon clock line 44, the period of the clock signal may be increased (i.e. the achievable clock frequency deceased) to allow for the margin of error for delay line 80 to be included.

Alternatively, phase borrowing may be handled by placing the flip-flops within the phase borrowing combinatorial logic block 14F (as mentioned above). Delay line 80 may be eliminated in such an embodiment.

Figure 11:
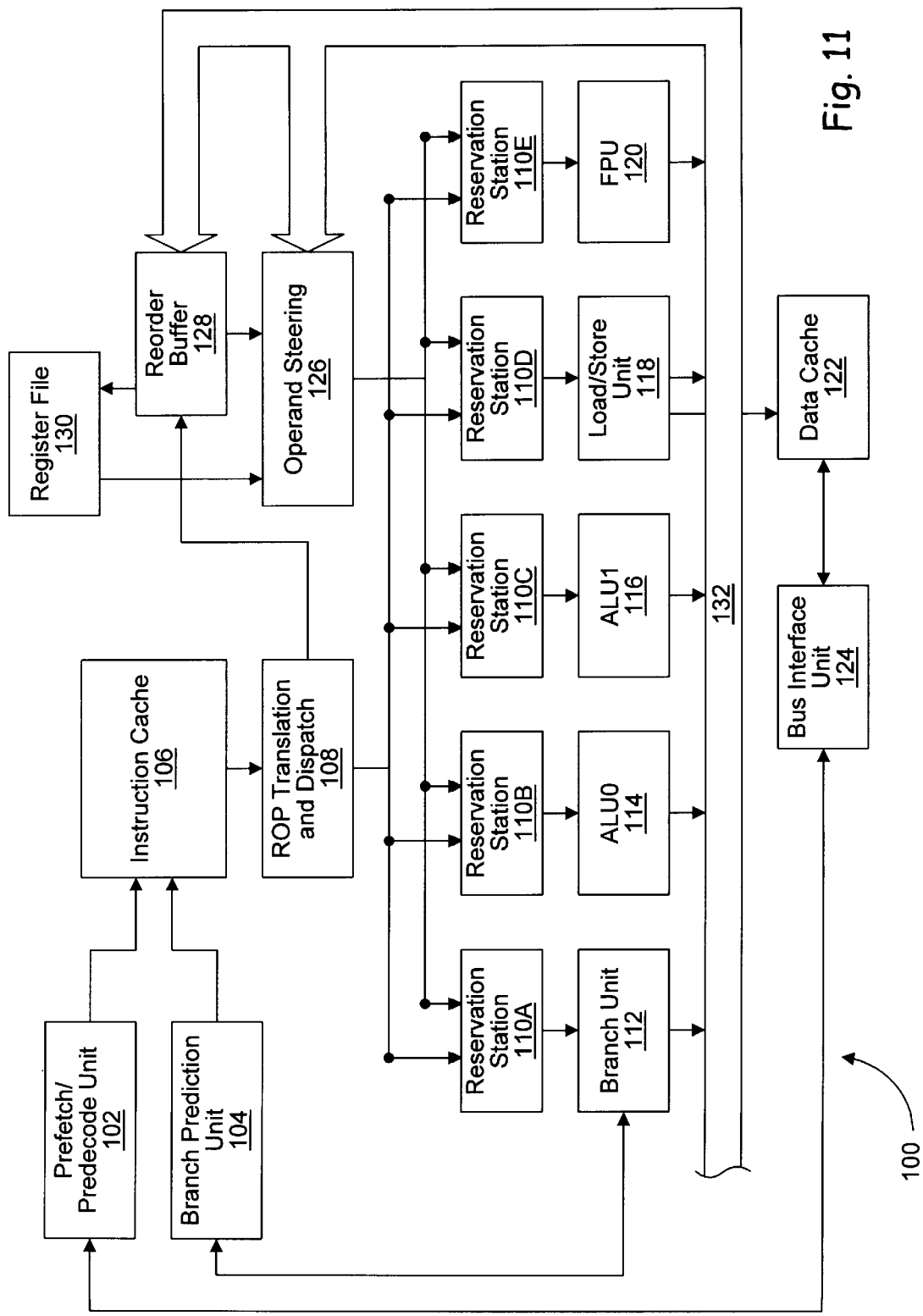
FIG. 11 is a block diagram of an exemplary microprocessor.

Turning now to FIG. 11, a block diagram of one embodiment of an exemplary microprocessor 100 is shown. Microprocessor 100 includes a prefetch/predecode unit 102, a branch prediction unit 104, an instruction cache 106, a RISC operation (ROP) translation and dispatch unit 108, a plurality of reservation stations 110A–110E, a branch unit 112, a first arithmetic/logic unit (ALU0) 114, a second arithmetic/logic unit (ALU1) 116, a load/store unit 118, a floating point unit (FPU) 120, a data cache 122, a bus interface unit 124, an operand steering block 126, a reorder buffer 128, and a register file 130. Prefetch/predecode unit 102 is coupled between bus interface unit 124 and instruction cache 106. Branch prediction unit 104 is coupled between branch unit 112 and instruction cache 106. Instruction cache 106 is coupled to ROP translation and dispatch unit 108, which is further coupled to reservation stations 110A–110E and reorder buffer 128. Reorder buffer 128 is further coupled to operand steering block 126, register file 130, and a plurality of result buses 132. Register file 130 is coupled to operand steering block 126 as well. Furthermore, operand steering block 126 is coupled to result buses 132 and reservation stations 110A–110E. Each reservation station 110A–110E is coupled to one of units 112–120 as shown in FIG. 11.

According to one embodiment, microprocessor 100 is configured to execute variable byte length instructions (e.g. the x86 instruction set). Microprocessor 100 converts the variable byte length instructions into one or more fixed length ROPs which are executed by units 112–120.

Prefetch/predecode unit 102 is configured to predecode cache lines of instruction bytes fetched from memory (via bus interface unit 124). According to one embodiment, prefetch/predecode unit 102 generates 5 bits of predecode information for each byte in the cache line. The predecode information indicates if the byte is a start or end byte, the number of ROPs used to perform the instruction, and the location of opcodes and instruction prefix bytes (if any).

Instruction cache 106 is a high speed cache memory for storing instruction bytes. Although any cache structure may be used, instruction cache 106 may comprise storage for 16 kilobytes of instruction code along with the corresponding predecode information. Storage may be allocated in 16 byte cache lines according to that embodiment.

Branch prediction unit 104 provides instruction fetch addresses for instruction cache 106 based upon branch prediction information stored for each cache line in instruction cache 106. The branch prediction information corresponding to a cache line fetched in a given clock cycle is used to generate a fetch address for the clock cycle succeeding the given clock cycle. Branch unit 112 executes branch instructions and provides branch misprediction information in the event that a misprediction is detected. Branch prediction unit 104 may correct the branch prediction information corresponding to the mispredicted branch instruction and passes the corrected fetch address to instruction cache 106 for instruction fetching.

Instruction bytes fetched from instruction cache 106 are conveyed to ROP dispatch and translation unit 108. The instruction bytes are placed into a byte queue within ROP dispatch and translation unit 108. ROP dispatch and translation unit 108 scans the byte queue and generates up to four ROPs per clock cycle (according to one embodiment). The generated ROPs are decoded and register operands fetched from reorder buffer 128 and register file 130. Each ROP is then conveyed to a reservation station 110A–110E coupled to a unit 112–120 configured to executed that ROP.

Operand steering block 126 is configured to route operands from register file 130, reorder buffer 128, and result buses 132 to reservation stations 110A–110E. Reservation stations 110A–110E store the ROPs dispatched thereto until the corresponding operands have been provided. The first ROP (in program order) within a particular reservation station 110A–110E for which operands have been provided is selected for execution in the corresponding unit 112–120.

As mentioned above, branch unit 112 executes branch instructions. ALU0 114 and ALU1 116 execute arithmetic/logic instructions. According to one embodiment, ALU0 114 is equipped with a shifter and ALU1 116 is equipped with a divider. Therefore, ALU0 114 executes shift-type instructions and ALU1 116 executes divide-type instructions. Other arithmetic/logic instructions may be executed by either ALU0 114 or ALU1 116. Load/store unit 118 executes load/store memory operations. In particular, load/store unit 118 generates addresses for each memory operation and accesses data cache 122 for the corresponding memory operand. According to one embodiment, load/store unit 118 is configured to perform up to two load/store accesses to data cache 122 in a given clock cycle. For load memory operations, load/store unit 118 forwards the memory operand via result buses 132. Finally, FPU 120 performs floating point operations.

Microprocessor 100 is configured to perform speculative, out of order instruction execution. Reorder buffer 128 is included to handle in-order retirement of instruction execution results, precise exceptions, and branch misprediction recovery. Each ROP is allocated a storage location within reorder buffer 128 upon dispatch of the ROP. Speculative results corresponding to the ROP are stored into the allocated storage location. Upon retirement of the ROP, the result is stored into register file 130 (if the destination of the ROP is a register location). Reorder buffer 128 provides dependency checking for register operands of ROPs being dispatched and, upon detection of a dependency upon an ROP represented therein, forwards either a reorder buffer tag identifying the operand (if the ROP generating the operand has not yet executed) or a speculatively generated value (if the operand is stored in reorder buffer 128).

Register file 130 includes a storage location for each architected register defined by the instruction set executed by microprocessor 100. Additionally, register file 130 may include one or more temporary registers for use by ROPs generated by ROP translation and dispatch unit 108. ROPs which generate an intermediate value for the corresponding instruction (i.e. the destination of the ROP is not a destination of the instruction from which the ROP is generated) may use the temporary registers as destination storage locations.

Operand steering block 126 is configured to route operands provided by reorder buffer 128, register file 130, and result buses 132 to reservation stations 110A–110E. Each ROP may thereby receive its operands upon dispatch or subsequent to dispatch to a reservation station 110A–110E.

Data cache 122 is a high speed cache memory for storing memory operands. According to one embodiment, data cache 122 is an 8 kilobyte, two port cache.

Bus interface unit 124 is configured to communicate between microprocessor 100 and other devices attached thereto. For example, bus interface unit 124 is configured to fetch instruction and data cache lines from a main memory system connected to microprocessor 100 when instruction cache 106 and data cache 122 detect cache misses. Additionally, if data cache 122 displaces a cache line in response to a cache miss and the cache line is modified with respect to main memory, bus interface unit 124 stores the modified cache line back to main memory.

Figure 12:
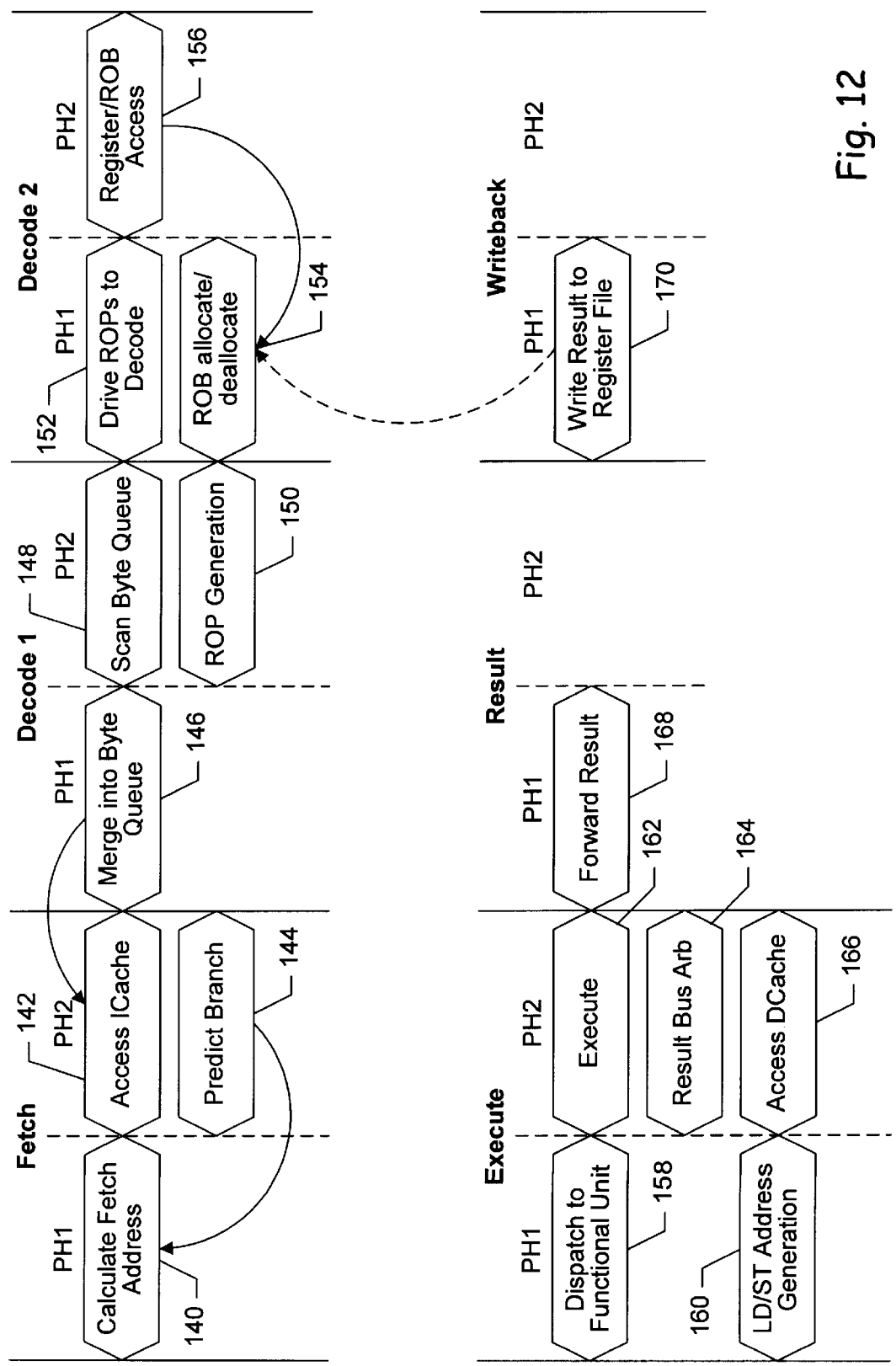
FIG. 12 is a pipeline diagram of a pipeline employed by the microprocessor shown in FIG. 11.

Turning now to FIG. 12, a pipeline diagram is shown illustrating a pipeline employed by a first implementation of microprocessor 100. The pipeline structure employed for the first implementation is a PH1/PH2 pipeline structure. Six pipeline stages are illustrated (i.e. fetch, decode1, decode2, execute, result, and writeback). Each stage includes a PH1 portion and a PH2 portion. The stages are delimited by solid vertical lines, and the PH1 and PH2 portions of a stage are separated by a vertical dashed line.

During the PH1 portion of the fetch stage, branch prediction unit 104 generates a fetch address based upon the branch prediction information read from instruction cache 106 during the preceding clock cycle, as well as from any branch misprediction or exception information detected via instruction execution (reference numeral 140).

During the PH2 portion of the fetch stage, instruction cache 106 is accessed (reference numeral 142). If a hit is detected, the branch prediction information corresponding to the hitting cache line is used to generate a fetch address in a succeeding clock cycle (reference numeral 144). In other words, a feedback path between the PH2 portion of the fetch stage and the PH1 portion of the fetch stage exists. In order to convert the pipeline represented by FIG. 12 into a second pipeline implementation in accordance with the present methodology, the feedback path is to be eliminated.

During the PH1 portion of the decode1 stage, the instructions fetched from instruction cache 106 are merged into the byte queue employed by ROP translation and dispatch unit 108 (reference numeral 146). The merging into the byte queue feeds back to the PH2 portion of the fetch stage. The feedback occurs when the byte queue becomes full. If the byte queue is full, the pipeline prior to the byte queue stalls until a portion of the byte queue is consumed (thereby freeing entries in the queue for additional instructions). This feedback path is to be eliminated as well.

During the PH2 portion of the decode1 stage, the byte queue is scanned and ROPs are generated from the instructions represented therein (reference numerals 148 and 150). The generated ROPs are conveyed to decoders within ROP translation and dispatch unit 108 for decode during the PH1 portion of the decode2 stage (reference numeral 152). Furthermore, microprocessor 100 determines whether or not reorder buffer 128 is capable of storing the ROPs being decoded and allocates storage for the ROPs (reference numeral 154). ROPs being retired are deallocated as well. Once the reorder buffer is updated, the reorder buffer is scanned for dependencies for the ROPs being dispatched (reference numeral 156). Therefore, the reorder buffer update and dependency checking is performed across the PH1/PH2 portions of the decode2 stage. Additionally, there is an implied feedback path from the retirement of ROPs in the PH1 portion of the writeback stage (reference numeral 170).

During the PH1 portion of the execute stage, an ROP is dispatched to the functional unit 112–120 which is configured to execute that ROP (reference numeral 158). If the ROP is a load/store operation, load/store unit 118 generates the address during the PH1 portion of the execute stage (reference numeral 160). During the PH2 portion of the execute stage, the ROP is executed (reference numeral 162). Additionally, the executing functional unit 112–120 arbitrates for result buses 132 (reference numeral 164). Certain of the functional units 112–120 may share a result bus, and therefore arbitrate for access to the result bus. Other units may be allocated a dedicated result bus (such as ALU0 114 and ALU1 116, for example). Load/store operations access data cache 122 during the PH2 portion of the execute stage (reference numeral 166).

During the PH1 portion of the result stage, the result is forwarded via result buses 132 to reorder buffer 128. Additionally, operand steering block 126 may route the result to one or more reservation stations 110A–110E if the ROPs therein are awaiting the result being provided (reference numeral 168).

Figure 13:
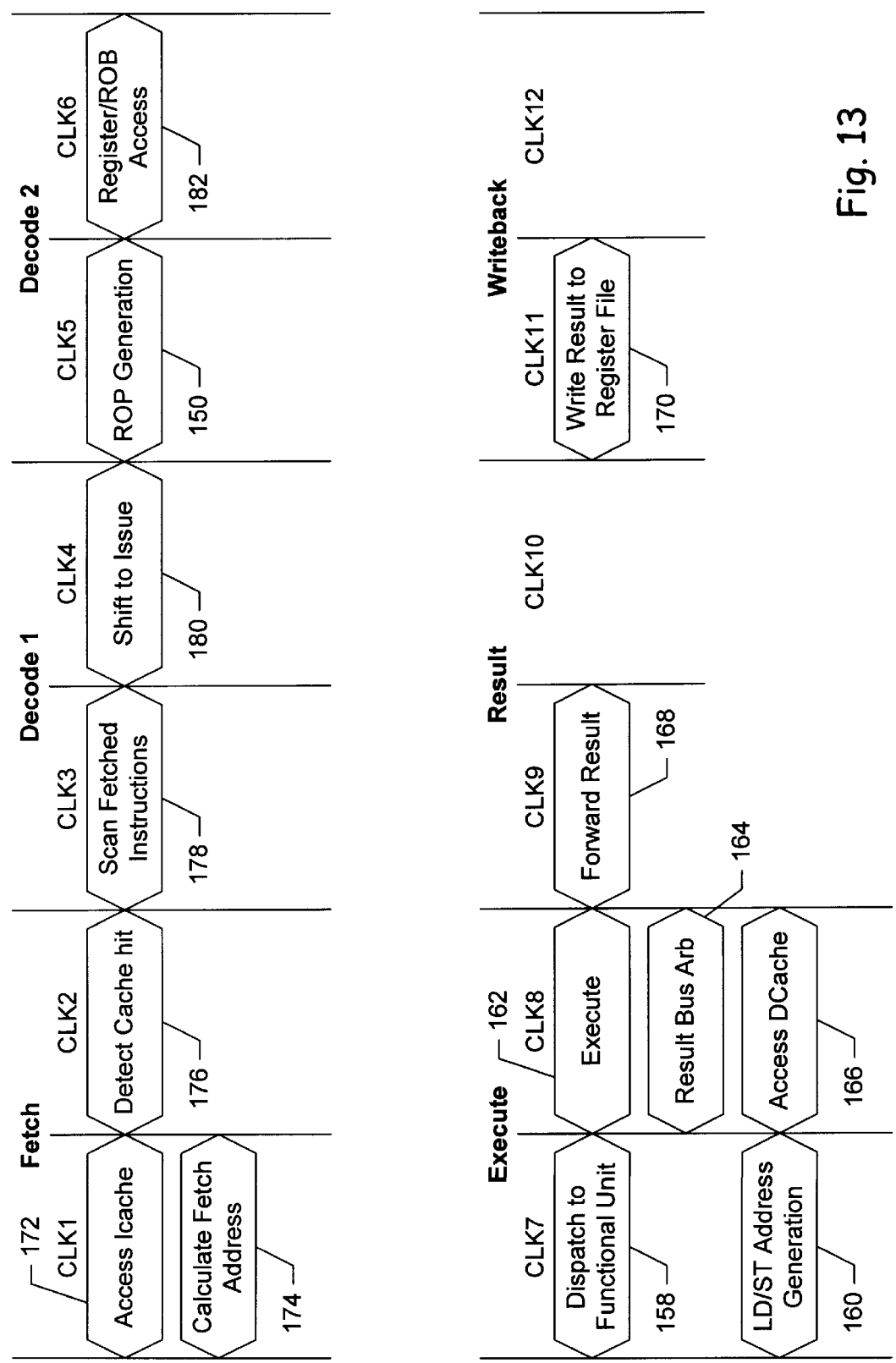
FIG. 13 is a pipeline diagram illustrating the pipeline employed by the microprocessor shown in FIG. 10 after conversion of the pipeline.

FIG. 13 illustrates the pipeline of FIG. 12 after conversion to an edge-triggered flipflop design. The original stages are illustrated for reference to FIG. 12 (i.e. fetch, decode1, decode2, execute, result, and writeback). However, each stage is represented by two clock cycles in the pipeline of FIG. 13. Each clock cycle is delimited by solid vertical lines. Stages of the pipeline which correspond to phases of the pipeline shown in FIG. 12 are numbered similarly.

Since a large amount of feedback is present in the fetch and decode1 stages of the pipeline, the redesign method of handling the feedback is selected in the present example. If the feedback were not eliminated, instructions could only be fetched every other clock cycle in the converted pipeline. Instructions would progress through the converted pipeline at the same rate as they progressed through the pipeline of FIG. 12, and a performance benefit would not be realized.

During clock cycle CLK1, instruction cache 106 is accessed and the fetch address is calculated for fetching in the subsequent clock cycle (reference numerals 172 and 174). In order to accomplish this, a way prediction for the subsequent cache line is stored in the branch prediction information for each cache line. Instead of determining if a cache hit occurs in instruction cache 106 for the current access and then calculating the fetch address from the corresponding branch prediction information, the fetch address is calculated by assuming the way prediction for the branch prediction address is correct. The branch information from the predicted way is used to calculate the subsequent fetch address. During clock cycle CLK2, the tag comparisons are completed and a determination of the cache hit or miss is detected (reference numeral 176). If a cache hit in a way other than the predicted way is determined, then the fetched instructions are discarded and the correct way is accessed. Cache misses are handled by fetching the missing instructions from memory. As long as instruction fetches hit in the predicted way, instructions can be fetched each clock cycle in the converted pipeline (i.e. double the bandwidth of the pipeline shown in FIG. 12).

The predecode information corresponding to the fetched instructions is scanned in clock cycle CLK3 (reference numeral 178) in order to locate the instructions within the fetched instruction bytes. Instead of placing the bytes in a byte queue which shifts to any byte position within the line, the instructions may be placed into a byte queue which operates independently on fixed portions of the cache line. For example, the cache line may be divided into an upper half and a lower half The halves may be scanned independently to locate instructions, and then the bytes may be shifted to align the located instructions to ROP decoders (reference numeral 180). Subsequently, ROP generation may occur (reference numeral 150).

During clock cycle CLK6, the reorder buffer is accessed and updated (reference numeral 182). Reorder buffer access and update was a two phase operation in the pipeline of FIG. 12 (reference numerals 154 and 156). However, modifications to the reorder buffer design are made to reduce the reorder buffer access to a clock cycle as in FIG. 13. For example, the ROPs selected for retirement may be written to register file 130 during a subsequent clock cycle, but may be forwarded from the reorder buffer if the dependency checking indicates that a dispatching ROP is dependent upon the retired ROP. Additionally, dependencies between concurrently dispatching ROPs may be detected by logic implemented independent of the reorder buffer. Therefore, it is not critical that the reorder buffer be updated and dependency checked in the same clock cycle. In this manner, the reorder buffer access may be reduced to a single clock cycle. Handling the reorder buffer paths in this example is a combination of piping out the reorder buffer and redesigning the dependency checking logic.

In addition to handling the feedback paths as illustrated by FIGS. 12 and 13, phase borrowing is handled as described above. The resulting pipeline may operate at approximately twice the frequency as the original pipeline. Performance may be approximately twice that of the original pipeline as well. Performance in the converted pipeline may be less than double the original pipeline to the degree that the clock frequency of the converted pipeline is not double that of the original. Furthermore, design changes may result in a reduction in performance. For example, way mispredictions in the way prediction scheme of the pipeline represented by FIG. 13 may lead to a reduction in performance from double that of the pipeline represented in FIG. 12. Other factors which may lessen performance include an increase in the branch misprediction penalty due to the larger number of pipeline stages prior to the misprediction. However, performance of a pipeline created by converting a PH1/PH2 pipeline as described above may often be a substantial improvement over the PH1/PH2 pipeline. Furthermore, the performance improvement may be achieved with minimal effort and cost, and may allow for lengthened original microprocessor design cycles.

In accordance with the above disclosure, a methodology for creating a microprocessor operating at approximately twice the frequency and performance of an existing microprocessor has been described. The methodology advantageously provides for substantially increasing the performance of an existing design at low cost and with a short design cycle. Employing the methodology may allow for a highly competitive product to be produced from an existing product, thereby enhancing market acceptance of the product.

Numerous variations and modifications will become apparent to those skilled in the art once the above disclosure is fully appreciated. It is intended that the following claims be interpreted to embrace all such variations and modifications.

What is claimed is:

1. A method for developing a second microprocessor from an existing first microprocessor having a pipeline structure comprising a set of latches clocked by a pair of non-overlapping clock signals, comprising:

replacing each of said set of latches with an edge-triggered flip-flop; and connecting a clock line to said edge-triggered flip-flops.

2. The method as recited in claim 1 wherein a clock signal upon said clock line is operable at approximately twice the frequency of said pair of non-overlapping clock signals if said second microprocessor is fabricated using a semiconductor fabrication technology used to fabricate said first microprocessor.

3. The method as recited in claim 1 further comprising determining if said pipeline structure includes a feedback path.

4. The method as recited in claim 3 further comprising tuning logic used to form said feedback path upon said determining that said pipeline structure includes said feedback path.

5. The method as recited in claim 4 wherein said tuning comprises reducing a number of logic levels within said logic such that said feedback path evaluates within one period of a clock signal conveyed upon said clock line during use.

6. The method as recited in claim 3 further comprising altering functionality of said pipeline structure to eliminate said feedback path upon said determining that said pipeline structure includes said feedback path.

7. The method as recited in claim 3 further comprising moving logic used to form said feedback path into a subsequent pipeline stage within said pipeline structure upon said determining that said pipeline structure includes said feedback path.

8. The method as recited in claim 1 further comprising determining if said pipeline structure employs phase-borrowing.

9. The method as recited in claim 8 further comprising adjusting a time at which a first flip-flop senses an input value of said first flip-flop upon said determining that said pipeline structure employs phase borrowing, wherein said first flip-flop is coupled between a phase-borrowing logic block and another logic block from which said phase-borrowing logic block is borrowing.

10. The method as recited in claim 9 wherein said adjusting comprises inserting a delay line between said clock line and said first flip-flop.

11. A method for developing a second microprocessor from an existing first microprocessor having a pipeline structure comprising a set of latches clocked by a pair of non-overlapping clock signals, comprising:

replacing each of said set of latches with an edge-triggered flip-flop;

connecting a clock line to said edge-triggered flip-flops;

determining if said pipeline structure includes a feedback path; and determining if said pipeline structure employs phase-borrowing.

12. The method as recited in claim 11 wherein a clock signal upon said clock line is operable at approximately twice the frequency of said pair of non-overlapping clock signals if said second microprocessor is fabricated using a semiconductor fabrication technology used to fabricate said first microprocessor.

13. The method as recited in claim 11 further comprising tuning logic used to form said feedback path upon said determining that said pipeline structure includes said feedback path.

14. The method as recited in claim 13 wherein said tuning comprises reducing a number of logic levels within said logic such that said feedback path evaluates within one period of a clock signal conveyed upon said clock line during use.

15. The method as recited in claim 11 further comprising altering functionality of said pipeline structure to eliminate said feedback path upon said determining that said pipeline structure includes said feedback path.

16. The method as recited in claim 11 further comprising moving logic used to form said feedback path into a subsequent pipeline stage within said pipeline structure upon said determining that said pipeline structure includes said feedback path.

17. The method as recited in claim 11 further comprising adjusting a time at which a first flip-flop senses an input value of said first flip-flop upon said determining that said pipeline structure employs phase borrowing, wherein said first flip-flop is coupled between a phase-borrowing logic block and another logic block from which said phase-borrowing logic block is borrowing.

18. The method as recited in claim 17 wherein said adjusting comprises inserting a delay line between said clock line and said first flip-flop.

19. A method for developing a first microprocessor and a second microprocessor, comprising:

designing, verifying, and manufacturing said first microprocessor, said first microprocessor having a pipeline structure comprising a set of latches clocked by a pair of non-overlapping clock signals; and developing said second microprocessor from said first microprocessor by:

(i) replacing each of said set of latches with an edge-triggered flip-flop;

(ii) connecting a clock line to said edge-triggered flip-flops;

(iii) determining if said pipeline structure includes a feedback path; and (iv) determining if said pipeline structure employs phase-borrowing.

20. The method as recited in claim 19 further comprising adjusting said feedback path upon said determining that said pipeline structure includes said feedback path.

21. The method as recited in claim 19 further comprising delaying a clock signal to one of said edge-triggered flip-flops upon said determining that said pipeline structure employs phase borrowing.

* * * * *